(12) United States Patent
Dube et al.

(10) Patent No.: US 8,394,712 B2
(45) Date of Patent: Mar. 12, 2013

(54) CAVITY-FREE INTERFACE BETWEEN EXTENSION REGIONS AND EMBEDDED SILICON-CARBON ALLOY SOURCE/DRAIN REGIONS

(75) Inventors: Abhishek Dube, Fishkill, NY (US); Viorel Ontalus, Danbury, CT (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 13/101,260

(22) Filed: May 5, 2011

(65) Prior Publication Data

US 2012/0280251 A1    Nov. 8, 2012

(51) Int. Cl.
    *H01L 21/20* (2006.01)
(52) U.S. Cl. ............. 438/607; 257/77; 257/E21.619; 257/E29.121
(58) Field of Classification Search ............. 438/607; 257/E29.121, E29.118, E21.619, E21.634, 257/77
    See application file for complete search history.

(56) References Cited

U.S. PATENT DOCUMENTS

| 5,397,724 | A | 3/1995 | Nakajima et al. | |
|---|---|---|---|---|
| 7,015,091 | B1 | 3/2006 | Wu | |
| 7,459,365 | B2 | 12/2008 | Rub et al. | |
| 7,504,704 | B2 | 3/2009 | Currie et al. | |
| 7,652,328 | B2 | 1/2010 | Yamasaki et al. | |
| 7,781,799 | B2 | 8/2010 | Yu et al. | |
| 2002/0072249 | A1* | 6/2002 | Nagasawa et al. | 438/778 |
| 2008/0182075 | A1 | 7/2008 | Chopra et al. | |
| 2009/0026545 | A1* | 1/2009 | Peidous | 257/368 |
| 2009/0140292 | A1 | 6/2009 | Liu et al. | |
| 2010/0090288 | A1 | 4/2010 | Holt et al. | |
| 2010/0136761 | A1* | 6/2010 | Han | 438/300 |
| 2010/0289086 | A1 | 11/2010 | Yu et al. | |
| 2011/0024840 | A1* | 2/2011 | Khater | 257/347 |
| 2012/0091469 | A1* | 4/2012 | Park et al. | 257/77 |
| 2012/0122283 | A1* | 5/2012 | Lee et al. | 438/287 |

\* cited by examiner

*Primary Examiner* — Caridad Everhart
(74) *Attorney, Agent, or Firm* — Scully, Scott, Murphy & Presser, P.C.; Katherine S. Brown, Esq.

(57) ABSTRACT

A gate stack is formed on a silicon substrate, and source/drain extension regions are formed around the gate stack. A dielectric spacer is formed around the gate stack. A pair of trenches is formed around the gate stack and the dielectric spacer by an etch so that sidewalls of the source/drain extension regions are exposed. Within each trench, an n-doped silicon liner is deposited on the sidewalls of the trenches by a first selective epitaxy process so that the interface between the dielectric spacer and the source/drain extension region is covered. Within each trench, an n-doped single crystalline silicon-carbon alloy is subsequently deposited to fill the trench by a second selective epitaxy process. A combination of an n-doped single crystalline silicon liner and an n-doped single crystalline silicon-carbon alloy functions as embedded source/drain regions of an n-type field effect transistor (NFET), which applies a tensile stress to the channel of the transistor.

25 Claims, 5 Drawing Sheets

CAVITY-FREE INTERFACE BETWEEN EXTENSION REGIONS AND EMBEDDED SILICON-CARBON ALLOY SOURCE/DRAIN REGIONS

BACKGROUND

The present disclosure generally relates to semiconductor devices, and particularly to field effect transistors including an embedded source/drain region having an n-doped silicon liner and an n-doped silicon-carbon alloy interior portion, and methods of manufacturing the same.

Carbon has a smaller atomic radius than silicon. As a consequence, a silicon-carbon alloy in which the atomic concentration of carbon does not exceed 2.5%, which is the solid state solubility limit for C in Si, can be grown epitaxially on a silicon surface. A silicon-carbon alloy has a smaller lattice constant than single crystalline silicon, and as such, a silicon-carbon alloy epitaxially grown and embedded in a trench within a single crystalline silicon substrate applies tensile stress to the surrounding regions. This property is advantageously employed to form n-type transistors having embedded n-doped silicon-carbon alloy source/drain regions so that a tensile stress applied to an n-type transistor enhances the mobility of minority charge carriers, i.e., mobility of electrons.

In order to prevent formation of an n-doped silicon-carbon alloy on undesirable locations, the deposition of embedded source/drain regions is performed by selective epitaxy. During selective epitaxy, a reactant gas and an etchant gas are flowed into a process chamber simultaneously or alternately in order to provide growth of a silicon-carbon alloy on crystalline silicon surfaces, while preventing continued deposition of a silicon-carbon alloy on dielectric surfaces. In some cases, the etchant gas can be formed as a natural byproduct of the reactant gas. For example, dichlorosilane ($SiH_2Cl_2$), which is a reactant for depositing silicon, generates hydrogen chloride (HCl) gas as a natural byproduct during the reaction, and thus, flowing dichlorosilane alone can achieve the effect of selective epitaxy because the byproduct HCl can function as an etchant for a selective epitaxy process. Additional HCl may also be provided, if desired, with dichlorosilane.

Experimentally, attempts to use an n-doped silicon-carbon alloy for embedded source/drain regions encounters a practical problem of cavity formation at an interface between preexisting source/drain extension regions and epitaxially grown N-type Silicon-Carbon. In prior art structures, deposition of the doped silicon-carbon alloy is limited by the supply of reactant gases into a geometry having a high aspect ratio at the interfaces between source/drain extension regions and the dielectric gate spacers. However, etching of the doped silicon material of the source/drain extension regions is not limited as much by the supply of etchant gases. Thus, the ratio between the deposition rate and the etch rate near the interface between the source/drain extension regions and the dielectric gate spacers is significantly lower than the ratio the deposition rate and the etch rate at locations farther away from the interface between the source/drain extension regions and the dielectric spacers. This local imbalance between the deposition rate and the etch rate induces formation of cavities during attempted selective epitaxy processes for depositing a silicon-carbon alloy. Further, the deposition of embedded doped silicon-carbon alloy portions proceeds anisotropically depending on the orientation of crystallographic surfaces of the underlying silicon surface. Thus, once the cavities are formed, deposition of a carbon-doped silicon material proceeds slowly along some orientations, preventing filling of the cavities, and thereby perpetuating the presence of the cavities. These cavities penalize the link-up resistance between extension and epitaxial source/drain regions causing a undesired resistance increase in the transistor.

Referring to FIG. 1, a prior art exemplary structure illustrates the formation of a cavity 133 at a junction among a preexisting semiconductor material, a dielectric material portion, and an epitaxially deposited phosphorus-doped silicon-carbon alloy. Specifically, the prior art exemplary structure includes a buried insulator layer 106, a p-doped single crystalline silicon layer 110, a source/drain extension region 132 including an n-doped single crystalline silicon material, and a dielectric material layer 150. A trench is formed in the p-doped single crystalline silicon layer 110 employing the dielectric material layer 150 as an etch mask so that a vertical sidewall of the source/drain extension region 132 is exposed. The vertical sidewall of the source/drain extension region 132 is typically vertically coincident with the sidewall of the dielectric material layer 150. A sidewall and a top surface of the p-doped single crystalline silicon layer 110 are also exposed at a lower portion of the trench. A phosphorous-doped silicon-carbon alloy portion 138 is deposited on the exposed semiconductor surfaces by selective epitaxy. The selective epitaxy process introduces some etching of the exposed semiconductor material. The etching is more prominent directly underneath the dielectric material layer 150 as discussed above, thereby producing a cavity 133 at the junction of the source/drain extension region 132 the dielectric material layer 150, and the phosphorous-doped silicon-carbon alloy portion 138. The lateral and vertical dimensions of the cavity 133 can be on the order of 30 nm. Typically, the cavity 133 is not filled even after deposition of a contact-level dielectric material layer 180, which typically includes silicon oxide.

Such cavities, when formed at an interface between a source/drain extension region and an embedded doped silicon-carbon alloy portion, have a deleterious effect on the performance of the field effect transistors because the resistance between an embedded doped silicon-carbon alloy portion, which function as a source/drain region, and the source/drain extension regions adjacent to the embedded doped silicon-carbon alloy portion increase with the size of the cavities. In order to provide a high performance transistor, the contact resistance between source/drain extension regions and embedded source/drain regions needs to be reduced.

BRIEF SUMMARY

A gate stack is formed on a silicon substrate, and source/drain extension regions are formed around the gate stack. A dielectric spacer is formed around the gate stack. A pair of trenches is formed around the gate stack and the dielectric spacer by an etch so that sidewalls of the source/drain extension regions are exposed. Within each trench, an n-doped silicon liner, such as phosphorus doped silicon, is deposited on the sidewalls of the trenches by a first selective epitaxy process so that the interface between the dielectric spacer and the source/drain extension region is covered. Within each trench, an n-doped silicon-carbon alloy is subsequently grown to fill the trench by a second selective epitaxy process. A combination of an n-doped single crystalline silicon liner and an n-doped single crystalline silicon-carbon alloy functions as embedded source/drain regions of an n-type field effect transistor (NFET), which applies a tensile stress to the channel of the transistor and enhances the mobility of electrons and the on-current of the NFET.

According to an aspect of the present disclosure, a method of forming a semiconductor structure is provided, which includes: forming a trench in a silicon substrate layer; forming an n-doped silicon liner on sidewalls and a bottom surface of the trench by selective epitaxy; and forming an n-doped silicon-carbon alloy portion on the n-doped silicon liner by selective epitaxy, wherein the trench is filled by the n-doped silicon-carbon alloy portion without any cavity therein.

According to another aspect of the present disclosure, a semiconductor structure is provided, which includes: a trench located in a single crystalline silicon substrate layer; an n-doped single crystalline silicon liner contacting sidewalls and a bottom surface of the trench and epitaxially aligned to the single crystalline silicon substrate layer; and an n-doped single crystalline silicon-carbon alloy portion contacting the n-doped silicon liner and filling the trench and epitaxially aligned to the n-doped single crystalline silicon liner.

DETAILED DESCRIPTION

Figure 1:
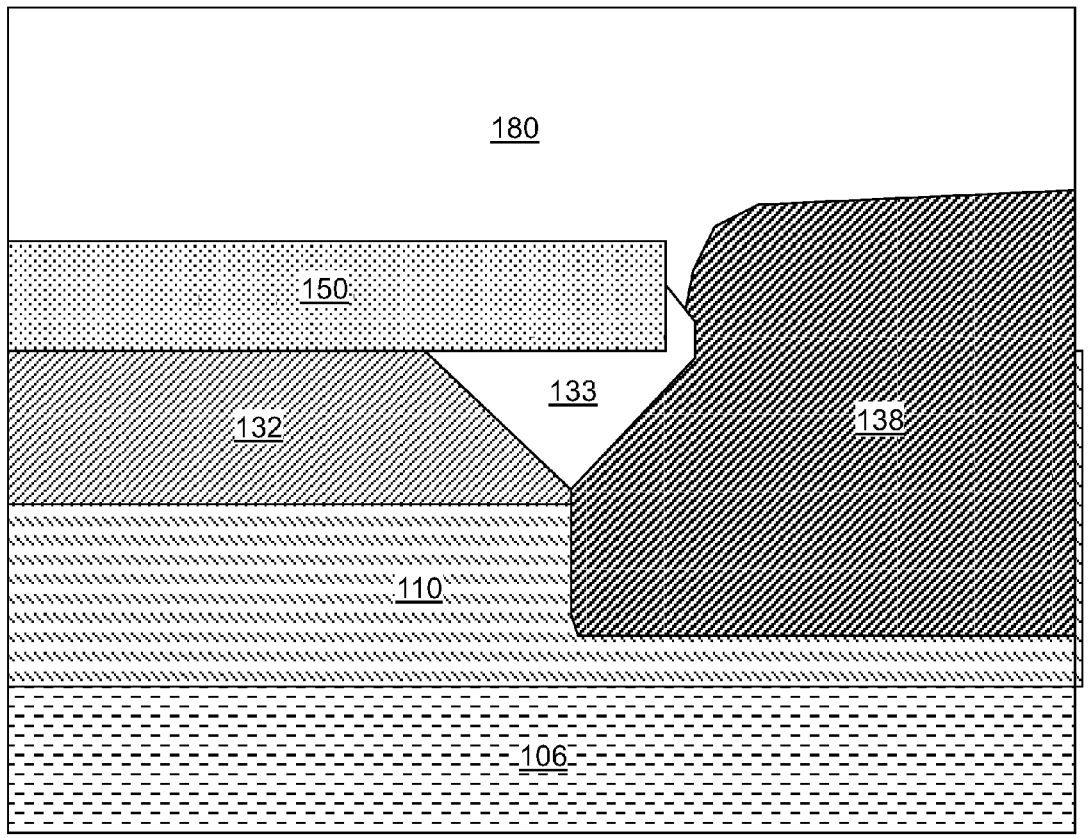
FIG. 1 is a vertical cross-sectional view of a prior art exemplary structure, which illustrates the formation of a cavity between a preexisting semiconductor material and a dielectric material portion.

As stated above, the present disclosure relates to field effect transistors including an embedded source/drain region having an n-doped silicon liner and an n-doped silicon-carbon alloy interior portion, and methods of manufacturing the same, which are now described in detail with accompanying figures. It is noted that like reference numerals refer to like elements across different embodiments. The drawings are not necessarily drawn to scale.

Figure 2:
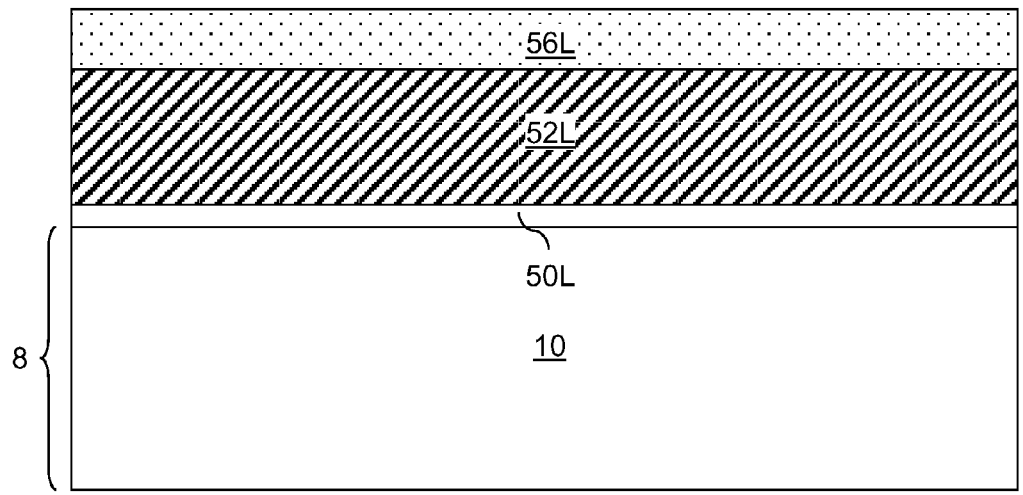
FIG. 2 is a vertical cross-sectional view of an exemplary semiconductor structure according to an embodiment of the present disclosure after formation of a gate dielectric layer, a gate conductor layer, and a gate cap dielectric layer.

Referring FIG. 2, an exemplary semiconductor structure according to an embodiment of the present disclosure includes a semiconductor substrate 8, which is a single crystalline silicon substrate layer 10 having a p-type doping. Thus, the single crystalline silicon substrate layer 10 consists essentially of silicon and p-type dopants. The p-type dopants included in the single crystalline silicon substrate layer 10 can be, for example, B, Ga, In, Tl, or a combination thereof. The concentration of the p-type dopants in the single crystalline silicon substrate layer 10 can be from $1.0 \times 10^{14}/cm^3$ to $1.0 \times 10^{19}/cm^3$, although lesser and greater concentrations can also be employed. The substrate 8 can be a bulk substrate consisting of the single crystalline silicon substrate layer 10, or can be a semiconductor-on-insulator (SOI) substrate including a stack, from top to bottom, of the single crystalline silicon substrate layer 10, a buried insulator layer (not shown), and a handle substrate (not shown).

Shallow trench isolation structures (not shown) can be formed in uppermost portions of the single crystalline silicon substrate layer 10 employing methods known in the art, e.g., by forming trenches extending from the top surface of the single crystalline silicon substrate layer 10, filling the trenches with a dielectric material, and removing excess dielectric material from above the top surface of the single crystalline silicon substrate layer 10.

A gate dielectric layer 50L, a gate conductor layer 52L, and a gate cap dielectric layer 56L are sequentially deposited, for example, by various chemical vapor deposition processes. The gate dielectric layer 50L includes a dielectric material, which can be silicon oxide, silicon nitride, silicon oxynitride, or a stack thereof. Alternately, the gate dielectric layer 50L can be a high dielectric constant (high-k) material layer having a dielectric constant greater than 8.0. In one embodiment, the gate dielectric layer 50L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, and preferably from 1.0 nm to 3 nm, although lesser and greater thicknesses can also be employed.

The gate conductor layer 52L includes a conductive material, which can be a doped semiconductor material, a metallic material, or a combination thereof. The doped semiconductor material, if employed, can be doped polysilicon, doped polycrystalline germanium, a doped silicon-germanium alloy, any other doped elemental or compound semiconductor material, or a combination thereof. The metallic material, if employed, can be selected to optimize the performance of a transistor to be subsequently formed. Metallic materials that can be included in the gate conductor layer 52L include, but are not limited to, Pt, Rh, Ir, Ru, Cu, Os, Be, Co, Pd, Te, Cr, Ni, TiN, Hf, Ti, Zr, Cd, La, Tl, Yb, Al, Ce, Eu, Li, Pb, Tb, Bi, In, Lu, Nb, Sm, V, Zr, Ga, Mg, Gd, Y, and TiAl, alloys thereof, conductive oxides thereof, conductive nitrides thereof, and any combinations of the foregoing. The gate conductor layer 52L can be deposited, for example, by chemical vapor deposition (CVD) and/or physical vapor deposition and/or any other deposition methods available in the art. The thickness of the gate conductive layer 52L can be from 20 nm to 300 nm, although lesser and greater thicknesses can also be employed.

The gate cap dielectric layer 56L includes a dielectric material such as silicon nitride, silicon oxide, organosilicate glass (OSG), a high dielectric constant (high-k) material layer that can be employed for the gate dielectric layer 50L, or a combination thereof. The gate cap dielectric layer 56L can be deposited, for example, by chemical vapor deposition or by any other deposition method known in the art. The thickness of the gate cap dielectric layer 56L can be from 10 nm to 200 nm, and typically from 20 nm to 100 nm, although lesser and greater thicknesses can also be employed.

Figure 3:
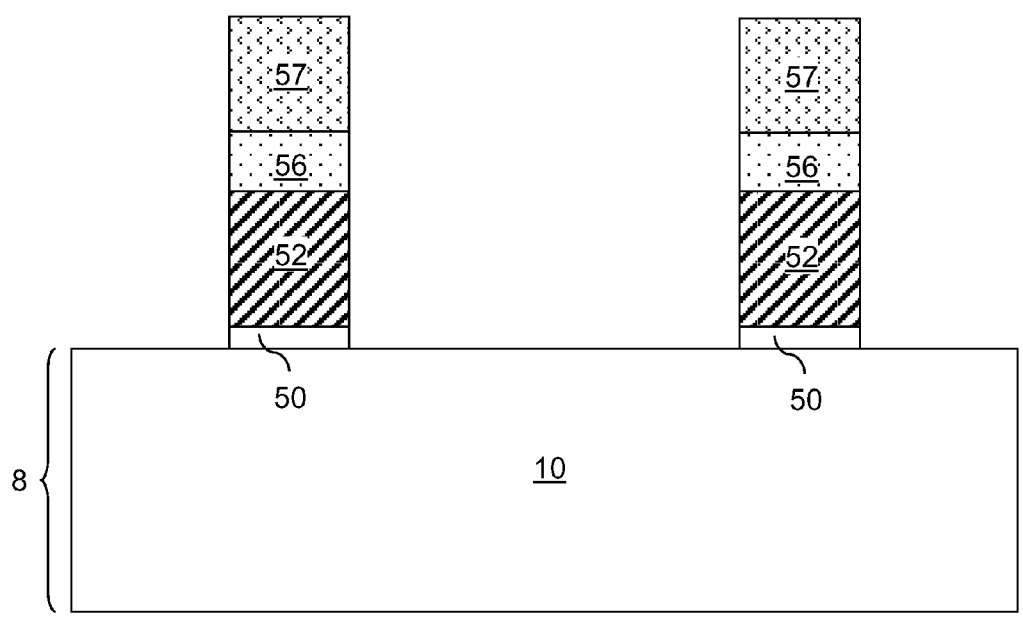
FIG. 3 is a vertical cross-sectional view of the exemplary semiconductor structure according to an embodiment of the present disclosure after formation of gate stacks.

Referring to FIG. 3, a photoresist 57 is applied over the gate cap dielectric layer 56L, and is lithographically patterned by lithographic exposure and development. The pattern in the photoresist is transferred into the stack of the gate cap dielectric layer 56L, the gate conductor layer 52L, and the gate dielectric layer 50L to form gate stacks.

Each gate stack includes, from bottom to top, a gate dielectric 50, a gate conductor 52, and a gate cap dielectric 56. Each gate cap dielectric 56 is a remaining portion of the gate cap dielectric layer 56L. Each gate conductor 52 is a remaining portion of the gate conductor layer 52L. Each gate dielectric 50 is a remaining portion of the gate dielectric layer 50L. The sidewalls of the gate stacks (50, 52, 56) are vertically coincident with the sidewalls of the patterned photoresist 57, i.e., are coincident with the sidewalls of the patterned photoresist 57 when viewed in a vertical direction. Each gate stack (50, 52, 56) contacts a top surface of the single crystalline silicon substrate layer 10. The photoresist 57 is subsequently removed, for example, by ashing.

Figure 4:
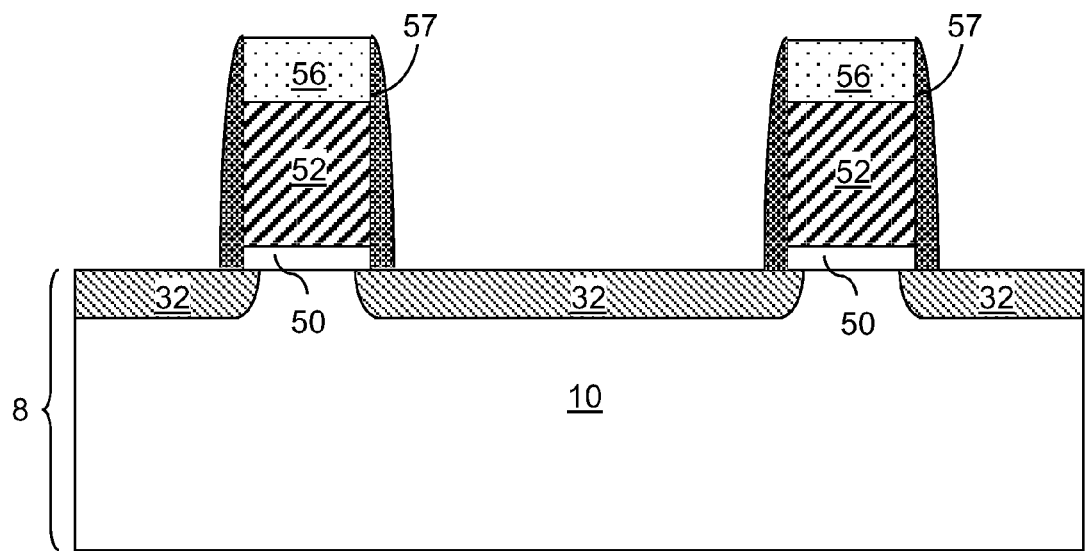
FIG. 4 is a vertical cross-sectional view of the exemplary semiconductor structure according to an embodiment of the present disclosure after formation of single crystalline source/drain extension regions.

Referring to FIG. 4, first gate spacers 57 are formed on sidewalls of the gate stacks (50, 52, 54, 56) by conformal deposition of a dielectric material layer and an anisotropic etch of horizontal portions of the dielectric material layer. The dielectric material of the first gate spacers 57 can be silicon oxide, silicon nitride, or a combination thereof. The remaining vertical portions of the dielectric material layer constitute the first gate spacers 57. Each first gate spacer 57 contacts and laterally surrounds a gate stack (50, 52, 56). Each first gate spacer 57 around a gate stack (50, 52, 56) is of unitary construction, i.e., contiguous throughout, and can be topologically homeomorphic to a torus. The lateral width of a first gate spacer 57, as measured at the base of a first gate spacer 57 between a sidewall of a gate stack (50, 52, 56) that the first gate spacer 57 contacts and an adjacent outer sidewall of the first gate spacer 57, can be from 1 nm to 80 nm, and typically from 2 nm to 30 nm, although lesser and greater widths can also be employed.

N-type dopants are implanted into upper portions of the single crystalline silicon substrate layer 10. The gate stacks (50, 52, 56) are employed as an implantation mask so that regions of the single crystalline silicon substrate layer 10 that are covered by the gate stacks (50, 52, 56) are not implanted, but regions that are not covered by the gate stacks are implanted with the n-type dopants. The n-type dopants can be P, As, Sb, or a combination thereof. Optionally, germanium, xenon, or carbon may also be implanted.

Implanted portions of the single crystalline silicon substrate layer 10 are converted into n-doped source/drain extension regions 32. The concentration of the n-type dopants in the n-doped source/drain extension regions 32 can be from $1.0 \times 10^{17}/cm^3$ to $1.0 \times 10^{21}/cm^3$, although lesser and greater concentrations can also be employed. The depth of the bottom of the n-doped source/drain extension regions 32, as measured from the topmost surface of the substrate 8, can be from 5 nm to 200 nm, and typically from 10 nm to 100 nm, although lesser and greater depths can also be employed. The n-doped source-drain extension regions 32 are single crystalline. Optionally, additional ion implantations may be performed. For example, halo ion implantations can be performed, in which p-type dopants are implanted at an angle so that a thin layer of highly p-doped halo regions are formed on the outer edge of the n-doped source/drain extension regions 32 underneath the gate stacks (50, 52, 56) as known in the art.

Figure 5:
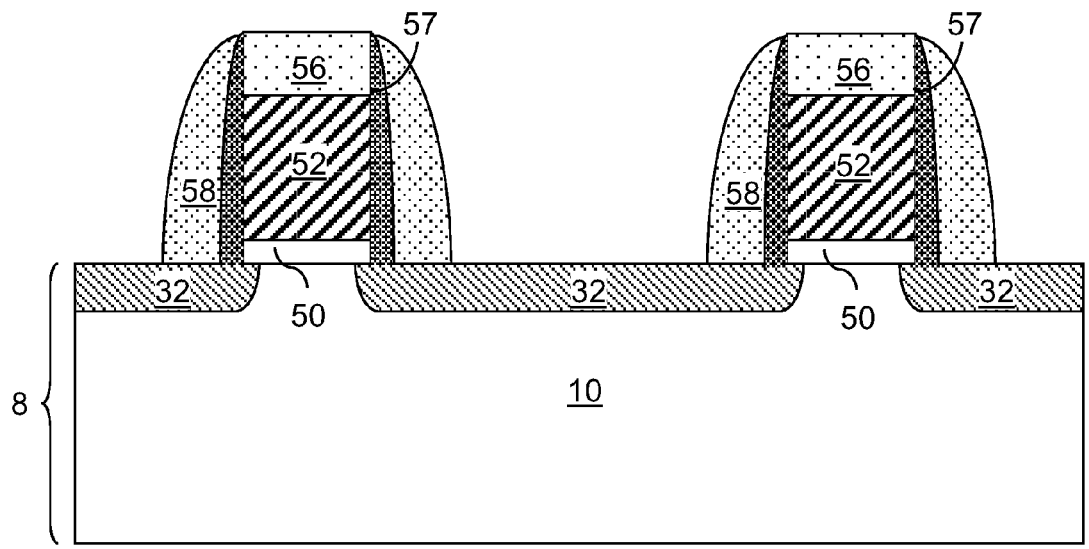
FIG. 5 is a vertical cross-sectional view of the exemplary semiconductor structure according to an embodiment of the present disclosure after formation of gate spacers.

Referring to FIG. 5, second gate spacers 58 are formed on sidewalls of the gate stacks (50, 52, 54, 56) by conformal deposition of a dielectric material layer and an anisotropic etch of horizontal portions of the dielectric material layer. The dielectric material of the second gate spacers 58 can be silicon oxide, silicon nitride, or a combination thereof. The remaining vertical portions of the dielectric material layer constitute the second gate spacers 58. Each second gate spacer 58 laterally surrounds a gate stack (50, 52, 56). Each second gate spacer 58 around a gate stack (50, 52, 56) is of unitary construction, i.e., contiguous throughout, and can be topologically homeomorphic to a torus. The lateral width of a second gate spacer 58, as measured at the base of a second gate spacer 58 between an outer sidewall of a first gate spacer 57 that the second gate spacer 58 contacts and an adjacent outer sidewall of the second gate spacer 58, can be from 2 nm to 150 nm, and typically from 10 nm to 100 nm, although lesser and greater widths can also be employed. Further, multiple gate spacers (not shown) can be formed and additional ion implantations can be formed to provide graded dopant concentration in the n-doped source/drain extension regions 32 and/or to provide multiple bottom surfaces (not shown) having different depths for the n-doped source/drain extension regions 32.

Figure 6:
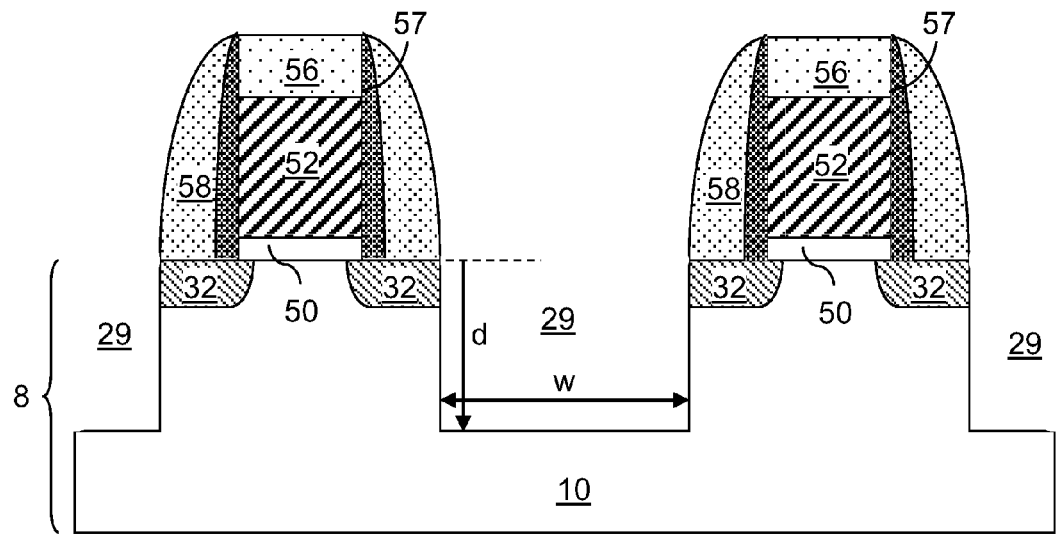
FIG. 6 is a vertical cross-sectional view of the exemplary semiconductor structure according to an embodiment of the present disclosure after formation of trenches within a single crystalline silicon substrate layer.

Referring to FIG. 6, trenches 29 are formed within the single crystalline silicon substrate layer 10 by an etch, which employs the gate stacks (50, 52, 56) and the first and second gate spacers (57, 58) as an etch mask. The exposed portions of the single crystalline silicon substrate layer 10, i.e., the portions of the single crystalline silicon substrate layer 10 that are not covered by the gate stacks (50, 52, 56) and the first and second gate spacers (57, 58), are removed by the etch. The etch can be an anisotropic etch that forms substantially vertical sidewalls within each trench 29.

During a first stage of the etching of the trenches 29, exposed portions of the n-doped source/drain extension region 32 are etched between adjacent pairs of second gate spacers 58. An n-doped source/drain extension region 32 that extends from underneath a peripheral portion of a gate stack (50, 52, 56) to underneath a peripheral portion of another gate stack (50, 52, 56) are divided into two smaller n-doped source/drain extension regions 32 that are not contiguously connected to each other. Each of the two divided n-doped source/drain extension regions 32 underlies a peripheral portion of only one gate stack (50, 52, 56) after formation of the trenches 29 that extend to the depth of the bottom surfaces of the n-doped source/drain extension regions 32. At the end of the first stage, the trenches 29 occupy the space of the etched portions of the n-doped source/drain extension regions 32.

During a second stage of the etching of the trenches 29, i.e., once the exposed portions of the n-doped source/drain extension region 32 are etched through, portions of the single crystalline silicon substrate layer 10 underlying the trenches 29 hithertofore formed are further etched. Thus, the trenches 29 continue to be recessed downward during the second stage of the etching of the trenches 29 to a depth d from the topmost surface of the single crystalline silicon substrate layer 10, which is located at the interface between the single crystalline silicon substrate layer 10 and the gate dielectrics 50. The bottom surfaces of the trenches 29 are formed below the bottom surface of the n-doped source-drain extension regions 32. The depth d can be from 10 nm to 400 nm, and typically from 20 nm to 200 nm, although lesser and greater depths can also be employed.

The sidewalls of the trenches 29 can be vertically coincident with the bottom portion of the sidewalls of the second gate spacers 58 because the outer edges of the bottom portions of the second gate spacers 58 define the locations of the sidewalls of the trenches 29. The width w of each trench 29 depends on the layout of the transistors to be formed, and can range from 20 nm to 2,000 nm, and typically from 40 nm to 1,000 nm, although lesser and greater widths can also be employed.

Figure 7:
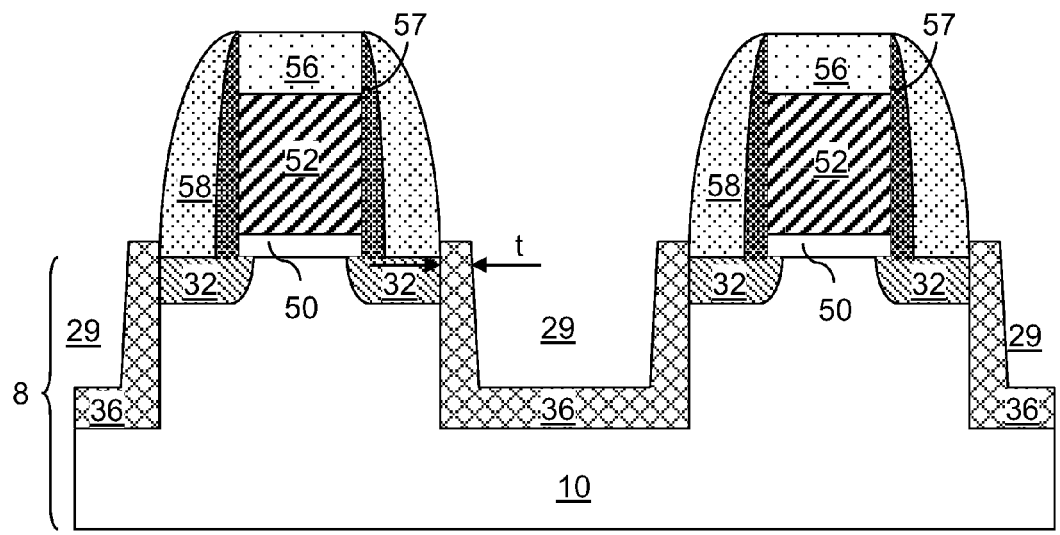
FIG. 7 is a vertical cross-sectional view of the exemplary semiconductor structure according to an embodiment of the present disclosure after formation of n-doped single crystalline silicon liners by a first selective epitaxy process.

Referring to FIG. 7, n-doped single crystalline silicon liners 36 are formed on all exposed surfaces of semiconductor materials by a first selective epitaxy process. Specifically, the n-doped single crystalline silicon liners 36 are deposited on sidewalls and the bottom surfaces of the trenches 29 during the first selective epitaxy process. To perform the first selective epitaxy process, the exemplary semiconductor structure, which includes the substrate 8, the trenches 29 located therein, and the gate stacks (50, 52, 56) and the spacers 58 located upon the substrate 8, is placed in a reaction chamber.

The reaction chamber can be a reduced pressure epitaxy chamber operating at a sub-atmospheric pressure or an atmospheric pressure epitaxy chamber operating at the atmospheric pressure. If a reduced pressure epitaxy chamber is employed, the operating pressure of the reduced pressure epitaxy chamber can be from 0.1 Torr to 600 Torr, and typically from 1 Torr to 100 Torr, although lesser and greater pressures can also be employed. Alternately, the reaction chamber can be a low pressure chemical vapor deposition chamber or an ultra-high vacuum chemical vapor deposition chamber. In this case, the reaction chamber can have a base pressure from $1.0 \times 10^{-10}$ Torr to $1.0 \times 10^{-3}$ Torr, and operate at a pressure range from $1.0 \times 10^{-3}$ Torr to $1.0 \times 10^{-1}$ Torr during the first selective epitaxy process.

The first epitaxy process is performed at an elevated temperature so that a silicon-containing reactant gas is decomposed and deposited on surfaces of the exemplary semiconductor structure. The optimal deposition temperature for the first selective epitaxy process depends on the species of the silicon-containing reactant gas and the process pressure, and is typically from 500° C. to 1,100° C., and typically from 600° C. to 1,000° C., although lesser and greater deposition temperatures can also be employed.

In one embodiment, the n-doped single crystalline silicon liners 36 are deposited by simultaneously flowing into the reaction chamber a combination of gases and an etchant gas. The step in which the deposition process and the etch process proceed concurrently is herein referred to as a "selective deposition step." The etch gas is introduced simultaneously with the deposition gases primarily to etch any polycrystalline or amorphous deposition occurring on the exposed dielectric surfaces e.g. silicon nitride, silicon oxide etc. to preserve the selectivity of the process where only grow epitaxial material on the exposed silicon regions only.

The combination of gases employed in the first selective epitaxy process includes a silicon-containing reactant gas and an n-type dopant gas. The silicon-containing reactant gas can be silane ($SiH_4$), dichlorosilane ($SiH_2Cl_2$), trichlorosilane ($SiHCl_3$), silicon tetrachloride ($SiCl_4$), disilane ($Si_2H_6$), a derivative thereof, or a combination thereof. The n-type dopant gas can be phosphine ($PH_3$), arsine ($AsH_3$), stibine ($SbH_3$), or a combination thereof. The ratio of the flow rate for the silicon-containing reactant gas to the flow rate for the n-type dopant gas can be from 100,000 to 100, although lesser and greater rates can also be employed. Optionally, a carrier gas can be included in the combination of gases. The carrier gas can be, for example, $H_2$, $N_2$, He, Ar, or a combination thereof. If employed, the ratio of the flow rate of the carrier gas to the flow rate of the silicon-containing reactant gas can be from 1,000 to 1, and typically from 200 to 5, although lesser and greater ratios can also be employed. The flow rates of the silicon-containing reactant gas, the n-type dopant gas, and the carrier gas (if employed), depends on the size, the operating pressure of the reaction chamber, and the desired deposition rate during the first selective epitaxy process.

The etchant is a gas that etches silicon at the elevated temperature, i.e., the deposition temperature of the first selective epitaxy process. The etchant can be, for example, HCl. The etchant can be flowed simultaneously with the combination of gases, or can be flowed alternately with the combination of gases. Optionally, a carrier gas such as $H_2$ or $N_2$ can be flowed with the etchant.

When the combination of gases and the etchant gas are simultaneously flowed into the reaction chamber, an n-doped silicon material is deposited on exposed silicon surfaces and exposed dielectric surfaces of the exemplary semiconductor structure while the combination of gases flow into the reaction chamber. An n-doped silicon material is deposited immediately, i.e., without any time delay after the turn-on of the silicon-containing reactant gas, on exposed silicon surfaces, which are the sidewalls and the bottom surfaces of the trenches 29. By selecting a deposition temperature that provides sufficient surface diffusion of adatoms on single crystalline surfaces of the sidewalls and bottom surfaces of the trenches, the deposited n-doped silicon material is added to the surfaces of the sidewalls and bottom surfaces of the trenches 29. As for the dielectric surfaces such as the surfaces of the gate cap dielectrics 56 and the second gate spacers 58, the n-doped silicon material must nucleate on the dielectric surfaces before deposition can proceed at any significant rate. The finite time interval between the beginning of the flow of the silicon-containing reactant gas and significant nucleation of n-doped silicon on dielectric material is referred to as a "nucleation time" or an "incubation time." The nucleation time is typically from 1 second to 30 seconds, although lesser and greater nucleation times are possible depending on the process parameters of the deposition step. In addition, the growth of a single crystalline silicon material, which occurs on single crystalline surfaces, is generally faster than the growth of a polysilicon, which occurs on dielectric surfaces, by a factor of about 2 under most deposition conditions. Thus, the thickness of the n-doped single crystalline silicon material that accumulates on sidewalls and bottom surfaces of the trenches 29 is greater than the thickness of any n-doped polysilicon that may nucleate and grow on the dielectric surfaces of the gate cap dielectrics 56 and the second gate spacers 58.

Because of the presence of the etchant gas during the selective epitaxy process, the etchant removes all of the n-doped non-crystalline material that may nucleate and grow on the dielectric surfaces of the gate cap dielectric 56 and the second gate spacers 58. The process time for the selective epitaxy process is selected such that a thin n-doped single crystalline silicon layer is deposited only on the sidewalls and bottom surfaces of the trench 29. In other words, the etch conditions including etchant flow, process temperature, etc., are sufficient to remove all non-crystalline material from the dielectric surfaces. The thickness of such a thin n-doped single crystalline silicon layer is typically from 3 nm to 10 nm.

The selective deposition step is a single processing step. During the selective deposition step, a deposition process and an etch process occur simultaneously. The etchant is added to the other process gases for deposition to keep the process selective i.e. only grow an epitaxial film on silicon and no deposition on the dielectric surface e.g. silicon nitride, silicon oxide etc. In this scheme the deposition component competes with an etch component at the various surfaces of the exemplary semiconductor structure. Because the deposition rate of an n-doped silicon material on a silicon surface does not require any nucleation time and an n-doped single crystalline silicon material grows faster than an n-doped polysilicon under the same deposition conditions, the process parameters of the first selective epitaxy process can be selected so that an n-doped single crystalline silicon material is deposited on the sidewalls and bottom surfaces of the trenches 29, while n-doped silicon materials are not deposited on the dielectric surfaces of the gate cap dielectrics 56 and the second gate spacers 58. On the surfaces of the sidewalls and bottom surfaces of the trenches 29, the deposition rate of the n-doped single crystalline silicon material, which is provided by the silicon-containing reactant gas and the n-type dopant gas, is greater than the concurrent etch rate of the n-doped single crystalline silicon material, which is provided by the etchant. On the surfaces of the gate cap dielectrics 56 and the second gate spacers 58, the nucleation rate of the n-doped polysilicon is less than the etch rate of the n-doped polysilicon. Thus, no material accumulates on the dielectric surfaces of the gate cap dielectric 56 and the second gate spacers 58 during the selective deposition step. Unlike a process where the deposition and etch steps alternate and can lead to etching of the underlying crystalline surface the epitaxy layer is supposed to grow on, the selective deposition step always preserves the underlying surface due to the simultaneous flow of the deposition gases with the etch gas used for cleaning the amorphous or polycrystalline nuclei growing on dielectric surfaces.

In some embodiments, the n-doped single crystalline silicon liners 36 can be deposited by flowing an n-type dopant gas and a silicon-containing reactant gas that generates an etchant gas as a byproduct. A carrier gas such as $H_2$, $N_2$, He, Ar, or a combination thereof can be employed as needed. A silicon-containing reactant gas that generates an etch gas includes dichlorosilane ($SiH_2Cl_2$) and trichlorosilane (Si$HCl_3$). Further, silicon tetrachloride ($SiCl_4$), when used in combination with hydrogen as a carrier gas, can also generate an etchant gas is employed as the silicon-containing reactant gas that generates an etchant gas as a byproduct. In the above examples, the byproduct etchant gas is HCl.

Thus, n-doped single crystalline silicon material accumulates on the sidewalls and the bottom surfaces of the trenches 29, which forms the n-doped single crystalline silicon liners 36. The combination of gases employed during the deposition steps does not include any carbon-containing material so that no carbon is incorporated into the n-doped single crystalline silicon liners 36. The absence of carbon in the n-doped single crystalline silicon liners 36 affects the characteristics of the first epitaxy process by rendering almost isotropic the deposition rate of the n-doped single crystalline silicon material deposited within the trenches 29. The near-isotropic deposition rates during the formation of the n-doped single crystalline silicon liners 36 contrasts with the prior art process for depositing embedded doped silicon-carbon alloy portions 138 directly on a silicon surface as illustrated in FIGS. 2 and 3, which has significantly anisotropic deposition rates that depend on the orientation of the underlying silicon surface. In other words, the absence of carbon in the combination of gases provide during each deposition step renders the deposition rates of n-doped single crystalline silicon nearly isotropic, i.e., independent of the crystallographic surface orientations of the underlying silicon material, and thus, prevents formation of any cavities between the n-doped single crystalline silicon liners 36, the n-doped source/drain extension regions 32, and/or the second gate spacers 58.

Because no cavity is formed in the first selective epitaxy process of the present disclosure, outer sidewall surfaces of the n-doped silicon liners 36 can contiguously contact an n-doped source/drain extension region 32 and a second gate spacer 58 across the interface there between. Each n-doped silicon liner 36 is single crystalline and is epitaxially aligned to the single crystalline silicon substrate layer 10 and other n-doped silicon liners 36. Each n-doped silicon liner 26 consists essentially of silicon and n-type dopants, and is free of carbon. The concentration of the n-type dopants in the n-doped single crystalline silicon liner 36 can be from $1.0 \times 10^{19}/cm^3$ to $1.0 \times 10^{21}/cm^3$, although lesser and greater dopant concentrations can also be employed. The thickness of the n-doped silicon liners 36 may be uniform, or may have a variation caused by step coverage of the first selective epitaxy process. The thickness t of the n-doped silicon liner 36, as measured on the sidewalls of the n-doped source/drain extension regions 32, can be from 5 nm to 50 nm, although lesser and greater thicknesses can also be employed.

Figure 8:
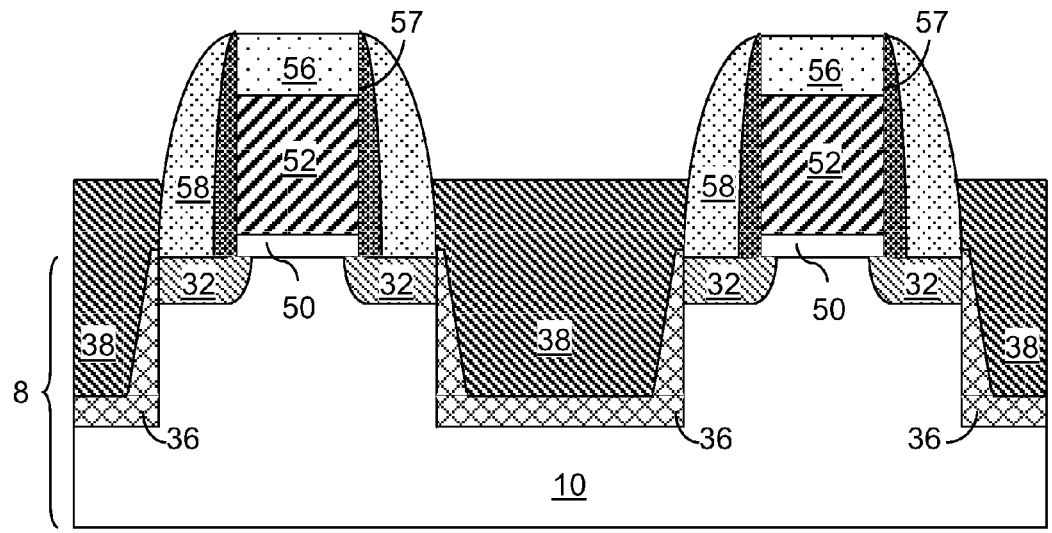
FIG. 8 is a vertical cross-sectional view of the exemplary semiconductor structure according to an embodiment of the present disclosure after formation of n-doped single crystalline silicon-carbon alloy portions by a second selective epitaxy process.

Referring to FIG. 8, n-doped single crystalline silicon-carbon alloy portions 38 are formed on all exposed surfaces of the n-doped single crystalline silicon liners 36 by a second selective epitaxy process. Specifically, the n-doped single crystalline silicon-carbon alloy portions 38 are deposited on sidewalls, top surfaces, and the bottom surfaces of the n-doped single crystalline silicon liner 36 during the second selective epitaxy process. To perform the second selective epitaxy process, the exemplary semiconductor structure, which includes the substrate 8, the n-doped single crystalline silicon liners 36, and the gate stacks (50, 52, 56) and the spacers 58 located upon the substrate 8, is placed in a reaction chamber, which can be the same reaction chamber as, or a different reaction chamber than, the reaction chamber employed for the first selective epitaxy process.

The reaction chamber can be a reduced pressure epitaxy chamber operating at a sub-atmospheric pressure or an atmospheric pressure epitaxy chamber operating at the atmospheric pressure as discussed above. Alternately, the reaction chamber can be a low pressure chemical vapor deposition chamber or an ultra-high vacuum chemical vapor deposition chamber as discussed above. The second epitaxy process is performed at an elevated temperature so that a silicon-containing reactant gas is decomposed and deposited on surfaces of the exemplary semiconductor structure.

If the combination of gases and the etchant are flowed alternately, the step in which the combination of gases is flowed is referred to as a "deposition step," and the step in which the etchant is flowed is referred to as an "etch step." By flowing the combination of gases and the etchant alternately, a series of deposition steps and a series of etch steps are performed alternately.

In one embodiment, the n-doped single crystalline silicon-carbon alloy portions 38 are deposited by simultaneously or alternately flowing into the reaction chamber a combination of gases and an etchant gas. The combination of gases employed in the second selective epitaxy process includes a silicon-containing reactant gas, a carbon-containing reactant gas, and an n-type dopant gas.

The silicon-containing reactant gas can be the same as in the first selective epitaxy process. The carbon-containing reactant gas can be acetylene ($C_2H_2$), ethylene ($C_2H_4$), ethane ($C_2H_6$), methane ($CH_4$), propylene ($C_2H_6$), propane ($C_2H_8$), or any other carbon-containing gas that can dissociate and provide carbon as a dopant atom. The ratio of the flow rate for the silicon-containing reactant gas to the flow rate for the carbon-containing reactant gas can be from 100,000 to 100, although lesser and greater rates can also be employed. The n-type dopant gas can be the same as in the first selective epitaxy process. The ratio of the flow rate for the silicon-containing reactant gas to the flow rate for the n-type dopant gas can be from 100,000 to 100, although lesser and greater rates can also be employed. Optionally, a carrier gas can be included in the combination of gases. The carrier gas can be, for example, $H_2$, $N_2$, He, Ar, or a combination thereof. If employed, the ratio of the flow rate of the carrier gas to the flow rate of the silicon-containing reactant gas can be from 1,000 to 1, and typically from 200 to 5, although lesser and greater ratios can also be employed. The flow rates of the silicon-containing reactant gas, the carbon-containing reactant gas, the n-type dopant gas, and the carrier gas (if employed), depends on the size, the operating pressure of the reaction chamber, and the desired deposition rate during the second selective epitaxy process.

The etchant is a gas that etches silicon at the elevated temperature, i.e., the deposition temperature of the second selective epitaxy process. The etchant can be, for example, HCl. The etchant can be flowed simultaneously with the combination of gases, or can be flowed alternately with the combination of gases. Optionally, a carrier gas such as $H_2$ or $N_2$ can be flowed with the etchant.

In one embodiment, the combination of gases and the etchant are flowed alternately in an alternating series of deposition steps and etch steps. During each deposition step, an n-doped silicon material is deposited on exposed silicon surfaces and exposed dielectric surfaces of the exemplary semiconductor structure while the combination of gases flow into the reaction chamber. An n-doped silicon material is deposited immediately on exposed silicon surfaces of the n-doped single crystalline silicon liners 36. By selecting a deposition temperature that provides sufficient surface diffusion of adatoms on single crystalline surfaces of the sidewalls, top surfaces, and bottom surfaces of the n-doped single crystalline silicon liners 36, the deposited n-doped silicon-carbon alloy is added to the surfaces of the sidewalls, top surfaces, and bottom surfaces of the n-doped single crystalline silicon liners 36. As for dielectric surfaces such as the surfaces of the gate cap dielectrics 56 and the second gate spacers 58, the n-doped silicon material must nucleate on the dielectric surfaces before deposition can proceed at any significant rate. The finite nucleation time, which is required for nucleation on the dielectric surfaces of the gate cap dielectrics 56 and the second gate spacers 58, limits deposition of an n-doped polysilicon-carbon alloy on the dielectric surfaces. In addition, the growth of a single crystalline silicon-carbon alloy, which occurs on a single crystalline surface, is generally faster than the growth of a polysilicon-carbon alloy, which occurs on a dielectric surface, by a factor of about 2 under most deposition conditions. Thus, the thickness of the n-doped single crystalline silicon-carbon alloy that accumulates on sidewalls, top surfaces, and bottom surfaces of the n-doped single crystalline silicon liners 36 is greater than the thickness of any n-doped polysilicon-carbon alloy that may nucleate and grow on the dielectric surfaces of the gate cap dielectrics 56 and the second gate spacers 58.

During each etch step, the etchant removes all of the n-doped polycrystalline silicon-carbon alloy material that may nucleate and grow on the dielectric surfaces of the gate cap dielectric 56 and the second gate spacers 58. However, the duration of each etch step is selected so that a finite fraction of the newly deposited n-doped single crystalline silicon-carbon alloy material on the sidewalls, top surfaces, and bottom surfaces of the n-doped single crystalline silicon liner 36 is retained at the end of the etch step. In other words, the duration of each etch step is longer than the time it takes to remove all polycrystalline silicon-carbon alloy material from the dielectric surfaces, but the duration of the etch thereafter is limited so that some of the n-doped single crystalline silicon-carbon alloy material deposited on the sidewalls, top surfaces, and bottom surfaces of the n-doped single crystalline silicon liner 36 during a previous deposition step is retained after the etch step.

The deposition steps and the etch steps are alternately repeated to accumulate n-doped single crystalline silicon-carbon alloy material on the sidewalls, top surfaces, and the bottom surfaces of the n-doped single crystalline silicon liners 36, which forms the n-doped single crystalline silicon-carbon alloy portions 38. Because the interfaces between each adjacent pair of an n-doped source/drain extension region 32 and a second gate spacer 58 are covered with an n-doped single crystalline silicon liner 36 during the second selective epitaxy process, the anisotropic nature of the growth of single crystalline silicon-carbon alloy during the second epitaxy does not cause formation of any cavities.

If the combination of gases and the etchant are flowed simultaneously, the second selective epitaxy process can be performed in a single selective deposition step in which a deposition process and an etch process proceed concurrently. The etchant is added to the other process gases for deposition to keep the process selective, i.e., only grow an epitaxial film on silicon while no deposition occurs on the dielectric surface such as surfaces of silicon nitride, silicon oxide, etc. During the selective deposition step, a deposition component competes with an etch component at the various surfaces of the exemplary semiconductor structure. Because the deposition rate of an n-doped silicon-carbon alloy material on a silicon surface does not require any nucleation time and an n-doped single crystalline silicon-carbon alloy material grows faster than an n-doped polycrystalline silicon-carbon alloy material under the same deposition conditions, the process parameters of the second selective epitaxy process can be selected so that an n-doped single crystalline silicon-carbon alloy material is deposited on the sidewalls, top surfaces, and bottom surfaces of the n-doped singe crystalline silicon liner 36, while n-doped silicon-carbon alloy materials are not deposited on the dielectric surfaces of the gate cap dielectrics 56 and the second gate spacers 58. On the surfaces of the sidewalls, top surfaces, and bottom surfaces of the n-doped single crystalline silicon liners 36, the deposition rate of the n-doped single crystalline silicon-carbon alloy material, which is provided by the silicon-containing reactant gas, the carbon-containing reactant gas, and the n-type dopant gas, is greater than the etch rate of the n-doped single crystalline silicon-carbon alloy material, which is provided by the etchant. As the deposition of the n-doped single crystalline silicon-carbon alloy portions 38 proceeds, on the surfaces of the n-doped single crystalline silicon-carbon alloy portions 38, the deposition rate of the n-doped single crystalline silicon-carbon alloy material continues to be greater than the etch rate of the n-doped single crystalline silicon-carbon alloy material. On the surfaces of the gate cap dielectrics 56 and the second gate spacers 58, the nucleation rate of the n-doped polycrystalline silicon-carbon alloy material is less than the etch rate of the n-doped polycrystalline silicon-carbon alloy material. Thus, no material accumulates on the dielectric surfaces of the gate cap dielectric 56 and the second gate spacers 58 during the selective deposition step.

In some embodiments, the n-doped single crystalline silicon-carbon alloy portions 38 can be deposited by flowing an n-type dopant gas, a carbon-containing reactant gas, and a silicon-containing reactant gas that generates an etchant gas as a byproduct. A carrier gas such as $H_2$, $N_2$, He, Ar, or a combination thereof can be employed as needed. A silicon-containing reactant gas that generates an etch gas can be the same as in the first selective epitaxy process.

The n-doped single crystalline silicon-carbon alloy portions 38 can completely fill the trenches 29 by the end of the second selective epitaxy process. The n-doped single crystalline silicon-carbon alloy portion 38 are single crystalline and epitaxially aligned to the underlying n-doped single crystalline silicon liners 36, the single crystalline silicon substrate layer 10, and one another.

The n-doped silicon liners 36 can be thinned to a thickness less than the original thickness during the initial phase of the deposition of the n-doped single crystalline silicon-carbon alloy portions 38 due to the etch component of the second epitaxy process. Thus, it is possible that the n-doped silicon liners 36 are not as conformal after formation of the n-doped single crystalline silicon-carbon alloy portions 38 as before formation of the n-doped single crystalline silicon-carbon alloy portions 38.

A pair of an n-doped single crystalline silicon liner 36 and an n-doped single crystalline silicon-carbon alloy portion 38 located directly thereupon can function as a source or a drain of a transistor or a common source and drain of an adjacent pair of transistors. Formation of cavities between an n-doped source/drain extension region 32 and an adjacent n-doped single crystalline silicon liner 36 is suppressed due to the change in anisotropy of the first selective epitaxy process, i.e., due to the near isotropic nature of the deposition during the first selective epitaxy process. Thus, the resistance between the n-doped source/drain extension region 32 and a laterally abutting source, drain, or a common source and drain, i.e., the pair of an n-doped single crystalline silicon liner 36 and an n-doped single crystalline silicon-carbon alloy portion 38, is reduced, and the on-current of the transistors in the exemplary semiconductor structure is enhanced over the on-current of prior art transistors in FIG. 2.

Figure 9:
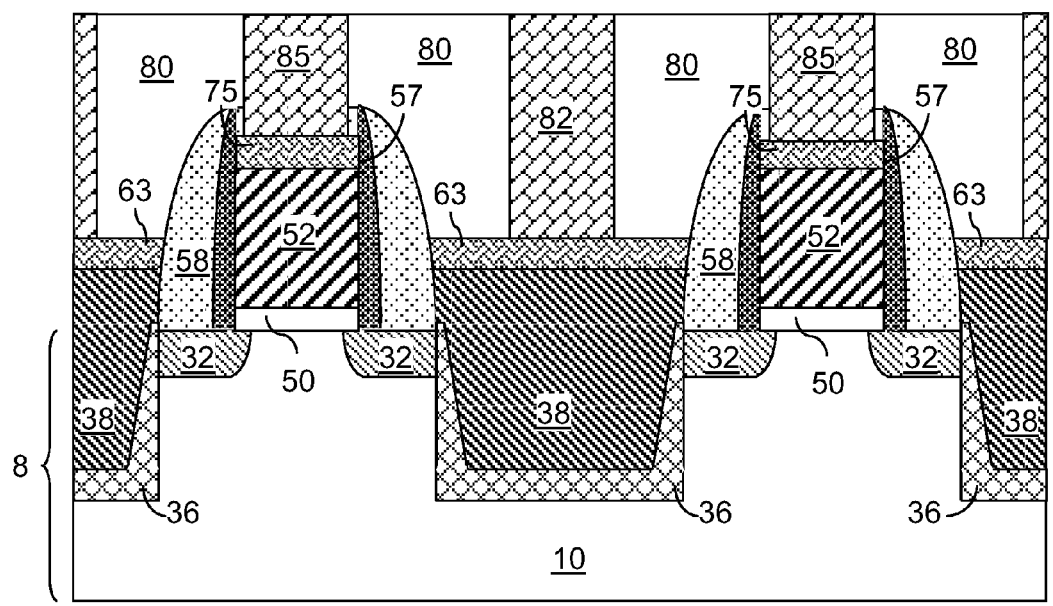
FIG. 9 is a vertical cross-sectional view of the exemplary semiconductor structure according to an embodiment of the present disclosure after formation of a contact-level dielectric material layer and contact via structures.

Referring to FIG. 9, metal silicide portions 63 can be optionally formed by reacting a metal with surface portions of the n-doped single crystalline silicon-carbon alloy portions 38 at an elevated temperature. If the gate conductors 52 include a semiconductor material, the gate cap dielectrics 56 can be removed, for example, by a wet etch, and upper portions of the gate conductors 52 can be reacted with a metal to form metal-semiconductor alloy portions 65 on top of the gate conductor 52. In this case, the formation of the metal silicide portions 63 and the formation of the metal-semiconductor alloy portions 65 can be performed simultaneously during the same anneal process.

A contact-level dielectric material layer 80 can be deposited and planarized. The contact-level dielectric material layer 80 includes a dielectric material such as silicon nitride, silicon oxide, organosilicate glass, or a combination thereof. The contact-level dielectric material layer 80 can be deposited, for example, by chemical vapor deposition or spin-coating.

Various contact via structures can be formed in the contact-level dielectric material layer 80. For example, the various contact via structures can include source/drain contact via structures 82, each of which is conductively connected to a source/drain (36, 38), which includes a stack of an n-doped single crystalline silicon liner 36 and an n-doped single crystalline silicon-carbon alloy portion 37. Further, the various contact via structures can include gate contact via structures 85, each of which is conductively connected to a gate conductor 52.

While the present disclosure is illustrated with a single crystalline silicon substrate layer 10 having a p-type doping and n-doped single crystalline source/drain extension regions 32, n-doped single crystalline silicon liners, and n-doped single crystalline silicon-carbon alloy portions 38, the doping types of the various components can be reversed. Thus, the present disclosure can be implemented in embodiments in which a single crystalline silicon substrate layer has an n-type doping, and p-doped single crystalline source/drain extension regions, p-doped single crystalline silicon liners, and p-doped single crystalline silicon-carbon alloy portions 38 are employed. The n-type dopant gases are correspondingly replaced with p-type dopant gases such as $B_2H_6$ in such embodiments.

While an embodiment in which permanent gate structures are formed before formation of source/drain (36, 38) is described herein, the methods of the present disclosure can also be employed in conjunction with replacement gate schemes in which the disposable gate structures (which correspond to gate dielectrics 50 and gate conductors 52) are replaced with permanent gate structures.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
   forming a trench in a silicon substrate layer;
   forming an n-doped silicon liner on sidewalls and a bottom surface of said trench by selective epitaxy; and
   forming an n-doped silicon-carbon alloy portion on said n-doped silicon liner by selective epitaxy, wherein said trench is filled by said n-doped silicon-carbon alloy portion without any cavity therein.

2. The method of claim 1, further comprising
   forming a gate stack on a silicon substrate layer; and
   forming a gate spacer around said gate stack, wherein said trench is formed by etching an exposed portion of said silicon substrate layer employing said gate stack and said gate spacer as an etch mask.

3. The method of claim 2, wherein a sidewall of said trench can be vertically coincident with a bottom portion of an outer sidewall of said gate spacer.

4. The method of claim 2, wherein said gate spacer and a top portion of said gate stack comprise a dielectric material.

5. The method of claim 2, further comprising forming an n-doped source/drain extension region in said silicon substrate layer by implanting n-type dopants into said silicon substrate layer employing said gate stack as an implantation mask after forming said gate stack and before forming said trench.

6. The method of claim 5, wherein a bottom surface of said trench is formed below a bottom surface of said n-doped source-drain extension region.

7. The method of claim 5, wherein said trench is formed by etching a portion of said n-doped source/drain extension region and a portion of said silicon substrate layer underlying said etched portion of said n-doped source/drain extension region.

8. The method of claim 7, wherein an outer sidewall surface of said n-doped silicon liner contiguously contacts said n-doped source/drain extension region and said gate spacer across an interface between said n-doped source/drain extension region and said gate spacer.

9. The method of claim 2, wherein said n-doped silicon-carbon alloy portion contacts said gate spacer.

10. The method of claim 9, wherein a top surface of said n-doped silicon-carbon alloy portion is located above a bottom surface of a gate dielectric in said gate stack.

11. The method of claim 1, wherein said silicon substrate layer, said n-doped silicon liner, and said n-doped silicon-carbon alloy portion are single crystalline and epitaxially aligned to one another.

12. The method of claim 11, where said silicon substrate layer consists essentially of silicon and p-type dopants, said n-doped silicon liner consists essentially of silicon and n-type dopants, and said n-doped silicon-carbon alloy portion consists essentially of silicon, carbon, and n-type dopants.

13. The method of claim 1, wherein said n-doped silicon liner is deposited by simultaneously flowing, into a reaction chamber including said silicon substrate layer having said trench therein, a combination of gases and an etchant gas, said combination of gases including a silicon-containing reactant gas and an n-type dopant gas, or by flowing an n-type dopant gas and a silicon-containing reactant gas that generates an etchant gas as a byproduct.

14. The method of claim 13, wherein dichlorosilane ($SiH_2Cl_2$) is employed as said silicon-containing reactant gas that generates an etchant gas as a byproduct.

15. The method of claim 13, wherein said n-doped silicon-carbon alloy portion is deposited by simultaneously or alternately flowing, into said reaction chamber or into another reaction chamber that includes said silicon substrate layer, another combination of gases and an etchant gas, said other combination of gases including a silicon-containing reactant gas, a carbon-containing reactant gas, and an n-type dopant gas, or by simultaneously flowing, into said reaction chamber, a carbon-containing reactant gas, an n-type dopant gas, and a silicon-containing reactant gas that generates an etchant gas as a byproduct.

16. The method of claim 15, wherein dichlorosilane ($SiH_2Cl_2$) is employed as said silicon-containing reactant gas during formation of said n-doped silicon-carbon alloy portion.

17. The method of claim 15, wherein no carbon-containing material is provided into said reaction chamber during said selective epitaxy of said n-doped silicon liner.

18. A semiconductor structure comprising:
a trench located in a single crystalline silicon substrate layer;
an n-doped single crystalline silicon liner contacting sidewalls and a bottom surface of said trench and epitaxially aligned to said single crystalline silicon substrate layer; and
an n-doped single crystalline silicon-carbon alloy portion contacting said n-doped silicon liner and filling said trench and epitaxially aligned to said n-doped single crystalline silicon liner without any cavity in said trench.

19. The semiconductor structure of claim 18, wherein a top surface of said n-doped silicon-carbon alloy portion is located above a bottom surface of a gate dielectric in a gate stack on said single crystalline silicon substrate layer.

20. The semiconductor structure of claim 18, where said single crystalline silicon substrate layer consists essentially of silicon and p-type dopants, said n-doped silicon liner consists essentially of silicon and n-type dopants, and said n-doped single crystalline silicon-carbon alloy portion consists essentially of silicon, carbon, and n-type dopants.

21. The semiconductor structure of claim 18, further comprising:
a gate stack contacting a top surface of said single crystalline silicon substrate layer; and
a gate spacer contacting and laterally surrounding said gate stack.

22. The semiconductor structure of claim 21, wherein one of said sidewalls of said trench is vertically coincident with a lower portion of a sidewall of said gate spacer.

23. The semiconductor structure of claim 21, further comprising an n-doped source/drain extension region embedded in said single crystalline silicon substrate layer and contacting said n-doped single crystalline silicon liner.

24. The semiconductor structure of claim 23, wherein an outer sidewall surface of said n-doped silicon liner contiguously contacts said n-doped source/drain extension region and said gate spacer across an interface between said n-doped source/drain extension region and said gate spacer.

25. The semiconductor structure of claim 23, wherein said n-doped single crystalline silicon-carbon alloy portion contacts said gate spacer upon formation, and is spaced from said n-doped source/drain extension region by said n-doped silicon liner.

* * * * *